(12) United States Patent
Shen

(10) Patent No.: US 6,472,702 B1
(45) Date of Patent: Oct. 29, 2002

(54) DEEP TRENCH DRAM WITH SOI AND STI

(75) Inventor: Wei-Lin Shen, Hsinchu (TW)

(73) Assignee: Winbond Electronics Corporation, Taiwan (TW)

( * ) Notice: Subject to any disclaimer, the term of this patent is extended or adjusted under 35 U.S.C. 154(b) by 0 days.

(21) Appl. No.: 09/495,752

(22) Filed: Feb. 1, 2000

(51) Int. Cl.⁷ ............................................. H01L 27/108
(52) U.S. Cl. ..................... 257/301; 257/296; 257/347
(58) Field of Search .................. 257/296, 297, 257/298, 300, 301, 302, 303, 304, 305, 310, 311, 347; 361/303, 306.3, 311

(56) References Cited

U.S. PATENT DOCUMENTS

| | | | |
|---|---|---|---|
| 4,820,652 A | * 4/1989 | Hayashi | 438/249 |
| 4,999,312 A | 3/1991 | Yoon | 438/392 |
| 5,102,819 A | * 4/1992 | Matsushita et al. | 438/245 |
| 5,309,008 A | 5/1994 | Watanabe | 257/304 |
| 5,371,032 A | * 12/1994 | Nishihara | 438/152 |
| 5,384,277 A | 1/1995 | Hsu et al. | 438/243 |
| 5,406,515 A | 4/1995 | Rajeevakumar | 365/182 |
| 5,432,105 A | * 7/1995 | Chien et al. | |
| 5,432,365 A | * 7/1995 | Chin et al. | |
| 5,508,219 A | 4/1996 | Bronner et al. | 438/152 |
| 5,525,531 A | * 6/1996 | Bronner et al. | |
| 5,563,085 A | * 10/1996 | Kohyama | |
| 5,770,484 A | 6/1998 | Kleinhenz | 438/155 |
| 5,888,864 A | * 3/1999 | Koh et al. | 438/253 |
| 5,893,735 A | * 4/1999 | Stengl et al. | 438/243 |
| 6,140,673 A | * 10/2000 | Kohyama | |
| 6,181,014 B1 | * 1/2001 | Park et al. | |
| 6,255,224 B1 | * 7/2001 | Kim | |

* cited by examiner

Primary Examiner—Nathan J. Flynn
Assistant Examiner—Kevin Quinto
(74) Attorney, Agent, or Firm—Finnegan, Henderson, Farabow, Garrett & Dunner, L.L.P.

(57) ABSTRACT

A method of forming dynamic random access memory (DRAM) comprising a deep trench capacitor with two electrodes and a node dielectric. The deep trench capacitor is formed by etching a deep trench, making a node dielectric on the surface of the trench, and filling the trench with poly-Si. The method also employs silicon on insulator (SOI) technology to form a single crystal Si layer on an insulator above the trench. The SOI is then contacted with the poly-Si electrode of the trench capacitor, and a transistor is fabricated above the trench capacitor. The method enables fabrication of a transistor above the trench capacitor and thereby frees space on the DRAM chip to allow for a greater density of devices on the DRAM chip.

7 Claims, 3 Drawing Sheets

DEEP TRENCH DRAM WITH SOI AND STI

BACKGROUND OF THE INVENTION

1. Field of the Invention

The present invention relates to the structure of and a method of fabricating deep trench dynamic random access memory (DRAM) using silicon on insulator (SOI) substrate and shallow trench isolation (STI) technologies. The deep trench DRAM of the present invention enables a greater density of devices on a DRAM memory chip. The present invention also simplifies the process for making deep trench DRAM by reducing the number of steps in the fabrication process over the prior art. Furthermore, the present invention has minimized electrical interaction, such as latchup, between devices of the DRAM.

2. Description of the Prior Art

Silicon on insulator (SOI) substrates are well known in the field of semiconductor fabrication for providing several advantages over standard silicon substrates. Building transistor devices on SOI substrates provides a lower substrate capacitance, reduces susceptibility to radiation damage, and also permits the use of a lower voltage for device operation. Several previous inventions exist which employ SOI substrates in combination with deep trench capacitors in various configurations.

Kleinhenz (U.S. Pat. No. 5,770,484) describes a trench capacitor and an SOI substrate. The deep trench capacitor is formed by a two-part etching process. A first trench is formed through a buried insulator layer, and a diffusion barrier collar is then formed on the sidewall of the first trench. Next, a second trench below the first trench is formed without any barriers on the sidewall, and the deep trench is filled with a doped poly-Si plug. A buried strap, comprising poly-Si, is deposited above the plug and makes contact with the SOI substrate containing the devices. Yoon (U.S. Pat. No. 4,999,312) describes a process for forming a trench capacitor similar to the Kleinhenz method, but Yoon's device is built on a silicon substrate. Watanabe (U.S. Pat. No. 5,309,008) discloses a top trench with a slightly larger diameter than a bottom trench formed beneath the top trench. The sidewall of the top trench is lined with an insulating diffusion barrier, and the sidewall of the bottom trench is diffused with dopants and serves as a capacitor electrode. Hsu et al. (U.S. Pat. No. 5,384,277) is directed to a method of forming a MOS DRAM simplified by combining the process for making a capacitor-drain strap with the process for forming a source/drain contact. Rajeevakumar (U.S. Pat. No. 5,406,515) describes low leakage trenches for DRAM comprising the formation of a diffusion ring in the upper part of the trench wall in the n-well region for reducing storage charge leakage. CMOS devices are built in an n-well formed in a p-epi layer over a p+substrate. Bronner et al. (U.S. Pat. No. 5,508,219) describes DRAM employing SOI with a trench capacitor. A strap poly-Si layer within the trench is used to form the connection between the poly-Si trench capacitor electrode and the side of the device layer, or drain region, of the SOI. Hayashi (U.S. Pat. No. 4,820,652) teaches an integrated process that fabricates a trench capacitor and an SOI wafer by epitaxial overgrowth. The inner electrode is connected to the transistor using a strap, and the trench is purposely offset with respect to the opening in the buried oxide allowing the trench capacitor plate sidewall to connect to the epitaxial layer.

These conventional processes to produce deep trench DRAM, however, suffer certain deficiencies. In the conventional processes the deep trenches are formed by etching through the SOI device layer and into the silicon substrate. Because no portion of the device layer remains above the trench, a field effect transistor (FET) comprising a source, drain and channel region in the device layer cannot reside above the trench. As a result, the connection between the trench capacitor electrode, formed within the trench, and the subsequently formed FET devices must be made through a sideways strap connection. More importantly, though, the inability to place devices above the trench leads to an inefficient use of space on the DRAM chip. Because the devices in the conventional processes must reside next to the trenches rather than above the trenches, the space above the trenches is often wasted. Additionally, in traditional devices, the buried strap connection becomes problematic when the dimensions of the chip are reduced; these problems include leakage currents and high resistance. Further evolution in the memory technology depends, not only on reduction in design feature size, but also on efficient use of the space available on the memory chip and on new methods for establishing connections between the capacitor and the active area.

Therefore, there is still a need for an improved process for forming a deep trench DRAM using an SOI substrate that reduces the number of steps required to produce a DRAM, improves the connection between the capacitor and the active area, and makes more efficient use of the space available on the DRAM.

SUMMARY OF THE INVENTION

Accordingly, the present invention is directed to a method of forming a semiconductor device and to a semiconductor device that substantially obviate one or more of the problems due to the limitations and disadvantages of the prior art. To achieve these and other advantages and in accordance with the purpose of the invention, as embodied and broadly described herein, the invention can comprise a method of forming a semiconductor device including (1) forming a masking layer on a silicon substrate and patterning an opening for etching a deep trench, (2) forming the deep trench for a DRAM capacitor by anisotropic etching, thereby forming the first electrode of the capacitor, (4) forming a node dielectric layer on the trench sidewall, (5) filling the trench with poly-Si to serve as the second electrode of the trench capacitor, (6) using wet etching and chemical mechanical polishing (CMP) to provide a flat surface above the trench, (7) forming an insulator layer, (8) opening the insulator layer to enable connection to the second electrode of the trench capacitor, (9) using SOI technology to form an active area of Si, and (10) using a shallow trench isolation (STI) technique for isolating the active area.

A semiconductor device formed by the method of the present invention has several advantages. By forming the deep trench capacitor prior to deposition of the SOI substrate, a connection between the active layer, or device layer, of the SOI substrate and the second electrode can be made directly above the deep trench capacitor. This arrangement enables fabrication of devices in the area above the deep trench capacitor to produce DRAM exhibiting efficient use of available chip space. The DRAM produced by the method of the present invention can have a higher density of devices on the surface of the chip than the DRAM of the prior art. It also provides an improved connection between the active area and the capacitor of the DRAM, and remedies the buried strap connection problems of the prior art.

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate the embodiments of the invention and together with the description, serve to explain the principles of the invention.

DESCRIPTION OF THE PREFERRED EMBODIMENTS

The present invention requires use of several technologies including deep trench etching, capacitor plate oxide nitride oxide (ONO) film fabrication, poly-Si filling, chemical mechanical polishing, SOI fabrication, and STI technology. In order to make the deep trench DRAM having a transistor fabricated over the trench, two challenges must be addressed. First, the SOI must be made with sufficient quality for use in high performance devices, and second, the STI etching curve must be controlled to match the demands of the present invention. To overcome the first of these two challenges, the quality of SOI of the present invention is enhanced by employing planarization technology to thin the SOI film and by using Si epitaxial growth technology to improve the quality of the active area of the SOI substrate. To eliminate the difficulty in fabricating the proper STI curve, etching chemicals such as KOH that exhibit different etching rates with respect to various Si crystal structures are used to control the shape of the STI etching curve, or STI inclined walls. The ratio of the different chemicals in the dry etch recipe are responsible for controlling the STI etching curve. The angle of the walls can vary between almost vertical and very slanted, and the STI depth is controlled by using an insulator as an etching stop layer.

Reference will now be made in detail to the present preferred embodiments of the invention, examples of which are illustrated in the accompanying drawings. Wherever possible, the same reference numbers will be used throughout the drawings to refer to the same or like parts. A process flow for making a deep trench capacitor DRAM consistent with the present invention is described next.

Figure 1:
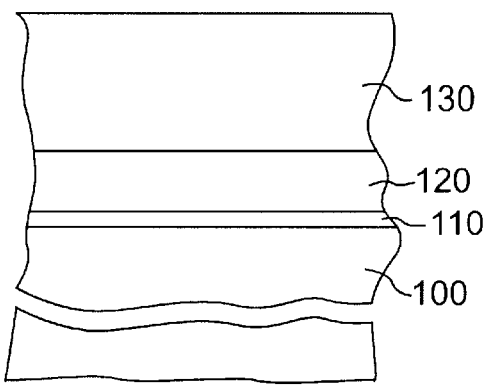
FIG. 1 is a sectional view of the silicon substrate and pad layers prior to deep trench formation.

Referring to FIG. 1, there is shown a silicon substrate 100 prior to formation of the deep trench. Layers 110, 120, and 130, formed on the silicon substrate, serve as a hard mask for etching the deep trench in the silicon. In the first step of forming the hard mask, a pad oxide layer 110 of $SiO_2$ is formed on the silicon substrate 100 by thermal oxidation or by another suitable process such as chemical vapor deposition (CVD). Pad oxide layer 110 is preferably 10 nm in thickness, and it serves to reduce the interface stress between the silicon substrate and a SiN pad layer 120. The SiN pad layer 120, deposited on the pad oxide layer 110, has a thickness of about 100 nm to 300 nm. Lastly, a tetraethoxysilane (TEOS) pad layer 130 is deposited on SiN pad layer 120 and has a thickness of about 200 nm to 800 nm. Pad layers 120 and 130 are preferably formed by CVD, but other suitable deposition processes may be used.

Figure 2:
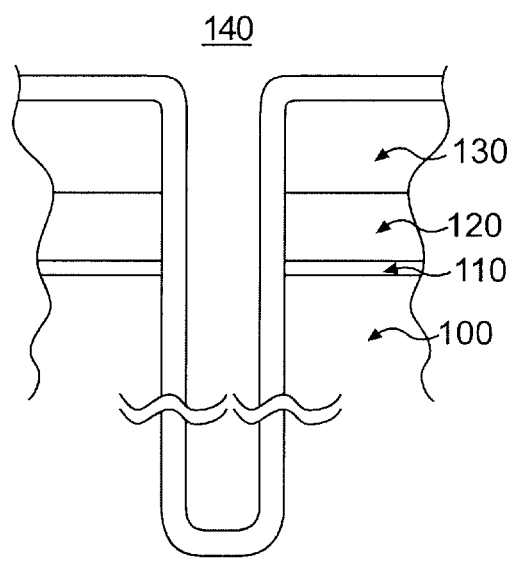
FIG. 2 is a sectional view of the deep trench after deposition of sidewall dopants.

FIG. 2 shows the deep trench formed in the silicon substrate 100 via etching. Using a photoresist mask (not shown), an opening is etched through hard mask layers 110, 120, and 130 and down to the silicon substrate 100 using reactive ion etching (RIE) or another suitable anisotropic etching process. Chemicals including $CHF_3$, CO, $CF_4$, or $O_2$ are used to etch through the hard mask layers 110, 120, and 130. Subsequently, the silicon substrate 100 is etched to form the deep trench. Etching of silicon substrate 100 is accomplished by an RIE technique using chemicals such as HBr, $NF_3$, or $O_2$ as dry etching reactants. Where possible, the photoresist mask itself may serve as the hard mask in etching the deep trench.

Figure 3:
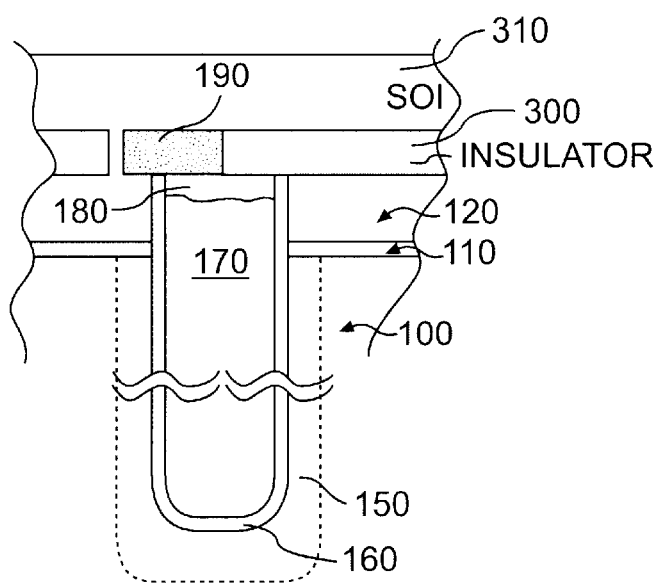
FIG. 3 is sectional view of the deep trench capacitor and SOI showing the contact between the deep trench capacitor and the SOI.

Once the trench is etched to the proper depth, usually on the order of several microns, a blanket layer of doped silicate glass 140 such as arsenic silicate glass (ASG) or phosphor silicate glass (PSG) is deposited on the sidewall of the trench to a thickness of about 40 nm to 100 nm. Doped silicate glass layer 140 can be deposited using CVD or another method suitable for forming thin films. Once deposited, the glass layer is heated using a furnace or a rapid thermal anneal to drive the dopants from the glass layer 140 and into the silicon substrate 100 to a concentration of about $2 \times 10^{17}$ to $3 \times 10^{19}$ atoms/cm$^2$. Region 150, depicted by the dashed line in FIG. 3, represents the area of the silicon substrate 100 into which the dopants diffuse. By diffusing dopants into the silicon substrate 100, the conductivity of the silicon substrate 100 in the region 150 is increased. Because the silicon substrate 100 operates as the first electrode of the deep trench capacitor, the greater conductivity produced by doping the silicon substrate 100 increases the conductivity of the first electrode of the trench capacitor. As a result, this increased conductivity greatly enhances the performance of the DRAM cell. The doping step can be omitted, however, if the silicon substrate 100 comprises a highly doped wafer. Such a wafer exhibits suitably high conductivity for operation as a capacitor electrode without the need for additional doping.

Referring to FIG. 3, once the sidewall of the deep trench is doped, the ASG or PSG layer 140 is stripped away. A capacitor node dielectric layer 160 comprising a capacitor plate ONO film is then formed on the trench sidewall. The capacitor plate ONO film comprises a composite dielectric film having both a nitride layer and an oxide layer. First, a nitride film having a thickness of about 7 nm to 10 nm is deposited on the sidewall of the trench preferably using CVD. The nitride film is then subjected to a thermal oxidation treatment to form the oxide component of the capacitor plate ONO film. The temperatures used to produce the oxide range from about 800° C. to 1000° C. The resulting composite dielectric film forms a very thin, high-quality dielectric layer 160 that exhibits minimal charge leakage. While the preferred embodiment includes the use of thermally oxidized nitride materials to form the composite dielectric layer of the capacitor, other functionally equivalent materials may be used for the capacitor dielectric where appropriate capacitance and reliability levels can be maintained.

After forming the capacitor node dielectric, the deep trench is filled with a poly-Si plug 170 to form the second electrode of the deep trench capacitor. CMP and wet etching is then employed to create a flat surface by removing the TEOS layer 130 and the excess material of the poly-Si plug 170 down to the level of the pad SiN layer 120. After creating the desired flat surface, the top surface 180 of the poly-Si plug 170 is dosed by implanting a high concentration of phosphorus or arsenic of about $1\times10^{12}$ to $1\times10^{14}$ atoms/cm$^2$. This dosage process is typically performed using ion implantation, traditional diffusion, or any other suitable processes. The dopants in the top region 180 of poly-Si plug 170 provide the necessary conductivity for contact between the deep trench capacitor and the SOI active area.

FIG. 3 depicts an insulating layer 300 formed on the flat surface created by CMP and wet etching. The insulating layer 300 can be an oxide, nitride, or other insulating material, and it serves as the insulating portion of the SOI substrate. Next, photolithography is used to open a contact window in the insulating layer above the poly-Si plug 170. Once the contact window is formed, a silicon layer 310 is deposited over the insulating layer 300 to serve as the active portion, or device layer, of the SOI substrate. Si layer 310 may be formed by epitaxial growth or zone melting recrystallization to a thickness of about 0.5 μm to 1.0 μm. In the latter process, the silicon layer 310 is first deposited as either amorphous or polycrystalline silicon. Next, the silicon layer 310 is melted using a laser beam, electron beam, or radiant heat, and finally it is allowed to recrystallize to form single crystal silicon. When the SOI substrate is complete, dopants are driven into contact region 190 by thermal annealing to a concentration of about $1\times10^{12}$ to $1\times10^{14}$ atoms/cm$^2$. Contact region 190 resides in the contact window of the insulating layer 300, directly above the poly-Si plug 170, and forms a contact between the top surface 180 of poly-Si plug 170 and the silicon device layer.

Figure 4:
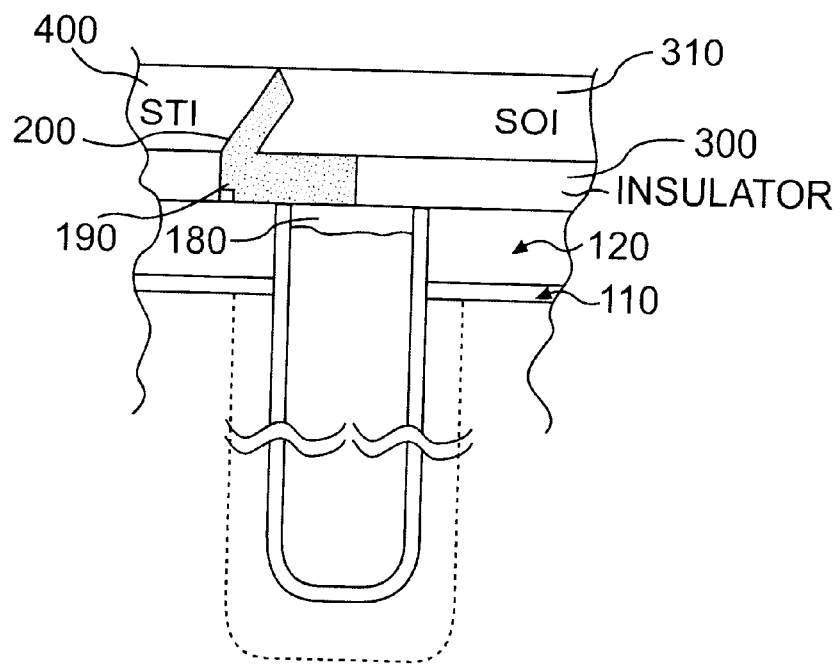
FIG. 4 is a sectional view of the deep trench capacitor including the shallow trench isolation (STI) insulator.

In FIG. 4, the SOI substrate is shown along with a shallow trench isolation (STI) structure 400. The STI structure 400 is made by forming a hard mask on the surface of the SOI 310 and then selectively wet etching a relatively shallow trench of about 2000 Å to 5000 Å into the SOI substrate. Using a solution such as KOH, the single crystal silicon of the SOI substrate can be etched at a special angle such that the walls of the STI structure are inclined at any angle from nearly vertical to about horizontal. Additionally, the STI structure can be dry etched via RIE. The etching process, forming the STI structure 400, results in an exposed sidewall of the SOI substrate at region 200. To make region 200 suitably conductive for serving as a portion of the contact between the trench capacitor at surface 180 and the active area of SOI 310, the exposed wall at region 200 is dosed with phosphorus or arsenic to about $2\times10^{12}$ to $3\times10^{13}$ atoms/cm$^2$. This dosage process is typically performed using ion implantation, traditional diffusion, or any other suitable processes. Finally, the STI structure 400 is completed by filling the shallow trench with TEOS or another insulating material and then planarizing the top surface by a CMP or etching process. The STI structure provides isolation for the active area of the SOI substrate.

Figure 5:
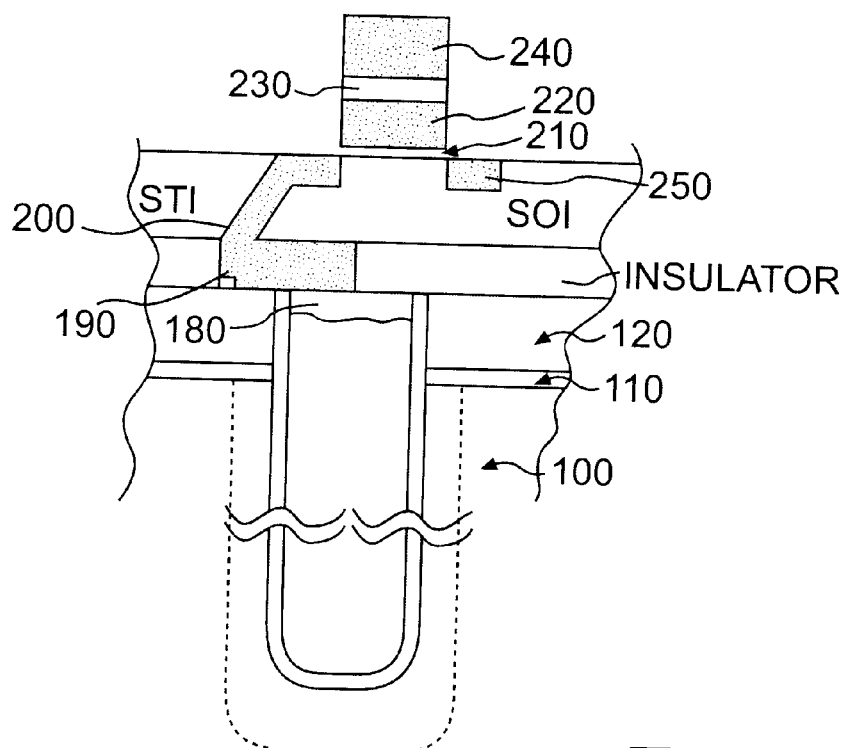
FIG. 5 is a sectional view of an example of the cell layout including the gate line fabricated above the deep trench capacitor.
Figure 6:
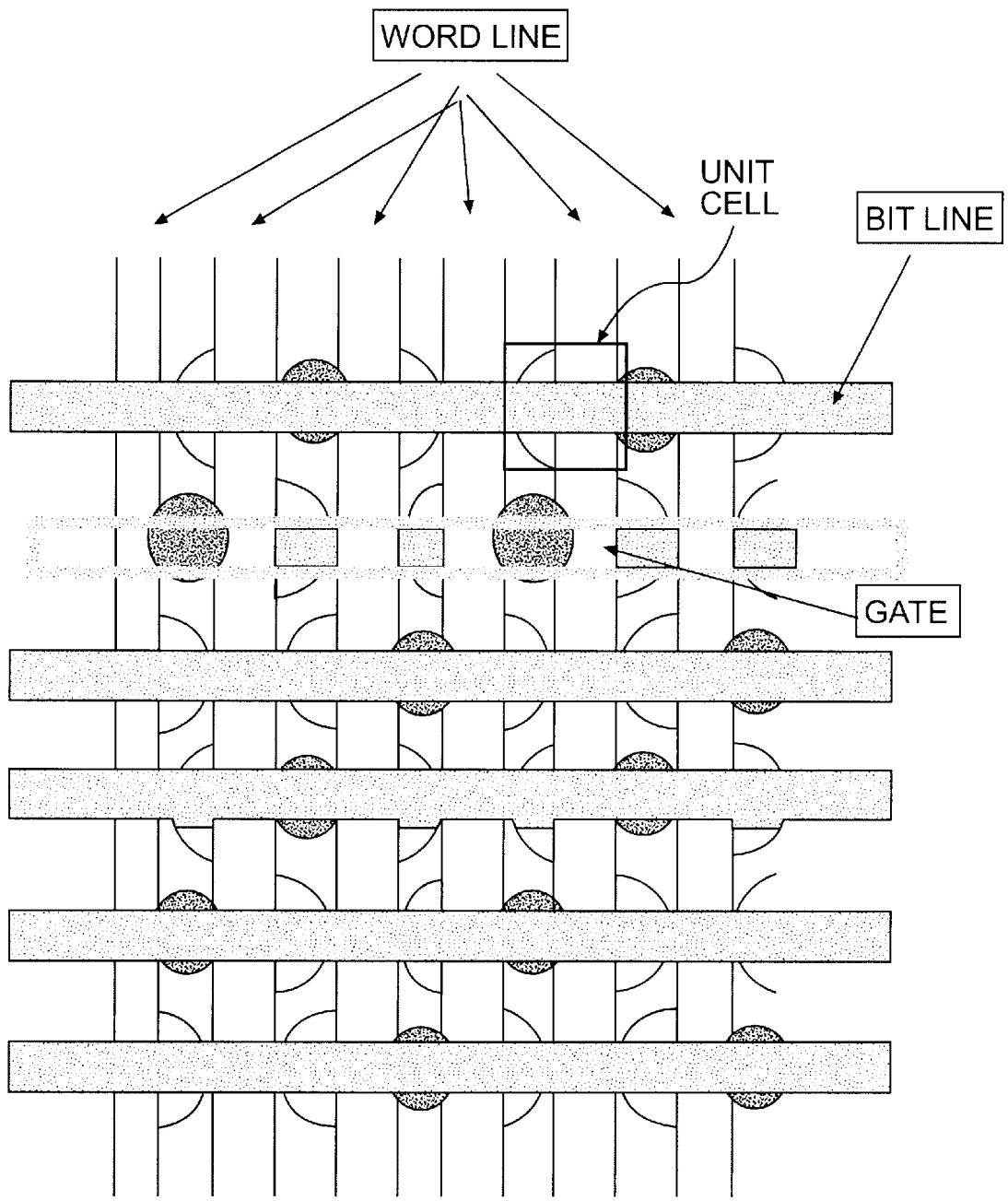
FIG. 6 is an aerial view of an example of the cell layout.

FIG. 5 shows the transistor fabricated above the deep trench capacitor. After forming the active area of the SOI substrate 310, normal methods known in the art are used to fabricate the transistor. The presence of the active area of the SOI substrate above the deep trench capacitor enables fabrication of the transistor above the deep trench capacitor. Referring to FIG. 5, the transistor components include a gate thermal oxide 210, a gate poly-Si word line 220, a gate tungsten silicide (WSi$_2$) word line 230, and a gate protected mask 240. The drain/source regions 250 are implant regions similar to regions 190 and 200. Drain/source regions 250 are areas of the device layer portion 310 of the SOI substrate that are made conductive by the introduction of diffused dopants such as arsenic or phosphorus. The regions 250, along with regions 180, 190 and 200, complete the connection between the second electrode 170 of the deep trench capacitor and the transistor, comprising elements 210, 220, 230 and 240, fabricated above the deep trench capacitor FIG. 6 provides a top view of an example of the DRAM cell layout. Because the process of the present invention enables the placement of a gate line above a trench capacitor, the space requirements of each DRAM unit cell is reduced. As a result, space is made available on the DRAM chip to add more devices.

The process outlined above reduces the long and complex process in forming a deep trench capacitor and isolating it. It also reduces the electrical problems from the Si substrate to the capacitor and transistors by preventing leakage current. Specifically, the present invention prevents the charge leakage that frequently occurs between the capacitor, first electrode, and buried strap of conventional DRAM designs. Finally, because the SOI is formed above the trench capacitor, more space is made available on the DRAM chip to add more devices.

It will be apparent to those skilled in the art that various modifications and variations can be made in the context of the present invention and in its practice without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device for DRAM, comprising:

a silicon substrate defining a horizontal plane;

a deep trench capacitor comprising a deep trench etched into said silicon substrate perpendicular to the horizontal plane, a dielectric formed on a sidewall of the deep trench, and a poly-Si plug filling the deep trench;

an insulator layer formed above said deep trench capacitor, wherein said insulator layer includes an open window located above said poly-Si plug;

a silicon device layer formed above said insulator layer, wherein a portion of said silicon device layer forms a contact region residing in the open window of the insulator layer;

a shallow trench isolation structure formed through the silicon device layer;

wherein said shallow trench isolation structure comprises a shallow trench etched into said silicon device layer such that at least one wall of the shallow trench is inclined with respect to an axis perpendicular to said horizontal plane; and a source/drain region for a transistor formed in an upper surface of the silicon device layer, wherein at least a portion of the source/drain region is located above the deep trench capacitor and is in contact with the contact region via conductive walls of the shallow trench isolation structure.

2. The semiconductor device of claim 1, wherein an upper surface of the poly-Si plug is dosed with at least one dopant.

3. The semiconductor device of claim 1, wherein said dielectric layer on the deep trench sidewall comprises a capacitor plate ONO film.

4. The semiconductor device of claim 1, further comprising a transistor fabricated on said silicon device layer such that at least a portion of a gate element of the transistor resides on an area of the silicon device layer located above the deep trench capacitor.

5. The semiconductor device of claim 4, wherein said transistor includes a gate thermal oxide, a gate poly-Si word line, a gate WSi word line, and a gate protected mask.

6. The semiconductor device of claim 1, wherein said silicon device layer comprises single crystal silicon.

7. The semiconductor device of claim 1, wherein the shallow trench isolation structure is filled with an insulating material.

* * * * *

UNITED STATES PATENT AND TRADEMARK OFFICE
CERTIFICATE OF CORRECTION

PATENT NO.    : 6,472,702 B1
DATED         : October 29, 2002
INVENTOR(S)   : Wei-Lin Shen It is certified that error appears in the above-identified patent and that said Letters Patent is hereby corrected as shown below:

<u>Column 6,</u>
Lines 64-65, "via conductive walls of the shallow trench isolation structure" should read -- via a conductive region of the silicon device layer adjacent to the shallow trench isolation structure --.

Signed and Sealed this

Third Day of June, 2003

JAMES E. ROGAN
*Director of the United States Patent and Trademark Office*